United States Patent [19]

Kashima et al.

[11] Patent Number: 4,975,752
[45] Date of Patent: Dec. 4, 1990

[54] LIGHT-EMITTING DIODE

[75] Inventors: Yasumasa Kashima; Masao Kobayashi; Takashi Tsubota, all of Tokyo, Japan

[73] Assignee: Oki Electric Industry Co., Ltd., Tokyo, Japan

[21] Appl. No.: 250,849

[22] Filed: Sep. 28, 1988

[30] Foreign Application Priority Data

Sep. 29, 1987 [JP] Japan .................. 62-246748
Feb. 22, 1988 [JP] Japan .................. 63-39208

[51] Int. Cl.⁵ .......................................... H01L 31/12
[52] U.S. Cl. ........................................ 357/19; 357/16; 357/17; 372/50; 372/48
[58] Field of Search ............... 357/17, 30 D, 30 E, 357/30 L, 30 P, 55, 19, 16, 56, 30 B, 30 H, 30 R; 372/43, 44, 45, 46, 50, 48

[56] References Cited

FOREIGN PATENT DOCUMENTS

| 55-121684 | 9/1980 | Japan | 357/30 P |
| 00925090 | 5/1984 | Japan | 357/17 |
| 59-219959 | 12/1984 | Japan | 357/19 |
| 0187080 | 9/1985 | Japan | 372/43 |
| 62-14479 | 1/1987 | Japan | 357/19 |
| 0014479 | 1/1987 | Japan | 357/19 |
| 0089389 | 4/1987 | Japan | 372/43 |
| 62-152185 | 7/1987 | Japan | 357/17 |

OTHER PUBLICATIONS 42 km Analog Video Signal Transmission in Singlemode Fibers Using a 1.3 μm Edge-Emitting LED; M. Matsuura et al., The Transactions of the IECL of Japan, vol. E 69, No. 4, Apr. 1986, pp. 349.
1.5 μm Tai Tammen Hakkogata Daiodo (A 1.5 μm Edge-Emitting LED); Denshi Jouhou Tushin Gakkai Soritu 70 Syunen Kinen Sougou Zenkokutaikai Syowa 62 nen (1987 General Meeting of the Institute of Electronics, Information and Communication Engineers of Japan), No. 882, 4–44.
A Study of Far-Field Patterns from High Performance 1.3-μm InGaAsP-InP Edge-Emitting LED's; Pascal Devoldere et al., IEEE Transactions on Electron Devices, vol. ED-30, No. 4, Apr. 1983.
140 Mb/s Transmission over 30 km of Single-Mode Fiber Using an LED Source; L. W. Ulbricht et al., Optoelectronic Devices Department, GTE Laboratories, Inc., IOOC-ECOC '85, pp. 819–822.

Primary Examiner—Andrew J. James
Assistant Examiner—Minh Loan Tran
Attorney, Agent, or Firm—Wenderoth, Lind & Ponack

[57] ABSTRACT

An LED includes a semiconductor substrate, a first blocking layer formed on this semiconductor substrate, a second blocking layer formed on this first blocking layer, a first V-channel extending from the second blocking layer to the semiconductor substrate, and a stripe-geometry light-emitting region formed in the first V-channel. Light is emitted from the LED from one edge of the light-emitting region due to a flow of current in the light-emitting region, to which the current is confined by the blocking layers. The LED also comprises a second V-channel disposed at a certain distance from the other edge of the light-emitting region. The optical path of the light emitted from this other edge, and an absorbing region is formed in the second V-channel. This absorbing region absorbs the light emitted form the other edge of the light-emitting region. The LED has excellent characteristics in which a stable output of spontaneously-emitted light can be obtained under a wide variety of operating conditions.

14 Claims, 10 Drawing Sheets

(FIBER: SINGLE-MODE FIBER, 10 μm DIA.)

FIG. 8I

LIGHT-EMITTING DIODE

BACKGROUND OF THE INVENTION

This invention relates to a light-emitting diode (LED) and a fabrication method thereof, and more particularly to an edge-emitting LED (EELED) having a stripe-geometry light-emitting region disposed in a V-shaped channel of a semiconductor substrate, which emits light from an edge of the light-emitting region.

Although LED's are characterized by a small optical output, they are superior to semiconductor lasers in temperature stability in that they operate reliably over a wide temperature range, and have other excellent features.

An EELED having a stripe-geometry light-emitting region is particularly suited as a light source for optical communications, because it permits control of the transverse mode parallel to the junction can be coupled to a single-mode optical fiber with high efficiency.

Figure 1:
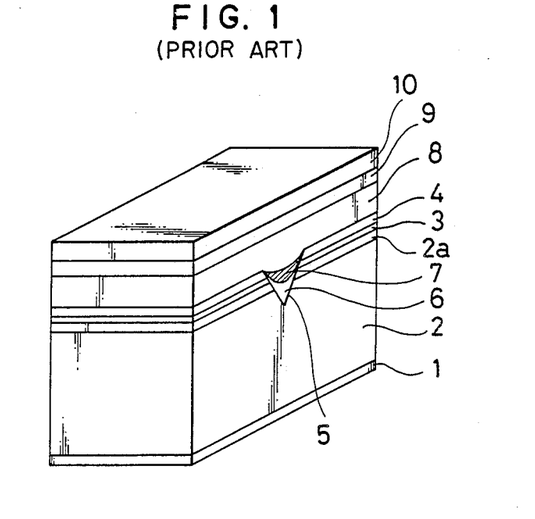
FIG. 1 is an oblique view of an LED according to the prior art.

An oblique view of the structure of a typical prior-art stripe-geometry EELED is shown in FIG. 1. The reference numerals in FIG. 1 will be used in the descriptions of other drawings showing identical components, and duplication of the explanations of these components will be avoided.

In this example, a first electrode 1 is provided on the lower surface of a p-InP semiconductor substrate 2. On the upper surface of the semiconductor substrate 2 is formed a buffer layer consisting of a p-InP layer 2a, and on the layer 2a is grown a first blocking layer consisting of an n-InP layer 3, over which is further grown a second blocking layer consisting of a p-InP layer 4.

On this semiconductor substrate 2 with its grown layers, a V-channel 5 is formed that penetrates from the second blocking layer 4 through the first blocking layer 3 and the buffer layer 2a and reaches the semiconductor substrate 2.

A p-InP layer 6 is formed on the inner surface of the V-channel 5 as a first cladding layer, and a p-InGaAsP layer 7 is formed as an active layer on the first cladding layer 6.

On the portion of the upper surface of the second blocking layer 4 in which the V-channel 5 has not been etched, and on the active layer 7 grown inside the V-channel 5, an n-InP layer 8 is formed as a second cladding layer. An n-InGaAsP layer 9 is further formed as a cap layer on this second cladding layer 8, and a second electrode 10 is formed on this cap layer 9.

In this way a stripe-geometry light-emitting region is created within the V-channel 5 by sandwiching the active layer 7 between the first cladding layer 6 and the second cladding layer 8.

In the structure described above, the drive current of the EELED is supplied from the first electrode 1 to the semiconductor substrate 2, is confined by the p-n junction formed by the first blocking layer 3 and the second blocking layer 4 to the active layer 7 disposed between the first and second cladding layers 6 and 8, and reaches the second electrode 10 through the cap layer 9. A spontaneous emission of light takes place at this time from the active layer 7 (the shaded area in the drawing) which forms the light-emitting region.

An EELED having a stripe-geometry light-emitting region formed in a V-channel, which delivers spontaneously-emitted light, does not differ in principle from a semiconductor laser with a V-channel stripe geometry. A consequent defect of an EELED described above is that at low operating temperatures, or when the drive current is increased to intensify the light output, a stimulated emission will frequently occur in the light-emitting region, so that the EELED, which should produce spontaneously-emitted light, emits laser light.

In prior-art EELED's, attempts have been made to suppress the occurrence of stimulated emission and obtain a spontaneous emission by applying an anti-reflective coating of silicon nitride having a coefficient of reflection of 1% or less to the facet of the semiconductor substrate that forms the emitting edge of the light-emitting region. The attempts are reported for example in "42 km Analog Video Signal Transmission in Single-mode Fibers Using a 1.3 μm Edge-Emitting LED," M. Matsuura et al, *The Transactions of the IECL of Japan*, Vol. E 69, No. 4, Apr. 1986, pp. 349ff, and in "1.5 μm Tai Tammen Hakkogata Daiodo" (A 1.5 μm Edge-Emitting LED), a paper presented at the "Denshi jouhou tushin gakkai soritu 70 syunen kinen sougou zenkokutaikai syowa 62 nen" (1987 General Meeting of the Institute of Electronics, Information and Communication Engineers of Japan), No. 882, 4–44.

A problem in the prior art described above is the incapability of producing a stable, spontaneous emission of light under a wide variety of operating conditions, because simply applying a anti-reflective coating to the emitting edge of a stripe-geometry light-emitting region does not suppress stimulated emission of light when the EELED is operated at a low temperature or a high optical output level.

SUMMARY OF THE INVENTION

An object of the present invention is to solve this problem of the prior art by providing an LED that produces a stable, spontaneous emission of light under a wide range of operating conditions, and a method for fabricating the same.

An LED according to this invention comprises a semiconductor substrate of a first conductive type, a first blocking layer of a second conductive type formed on this semiconductor substrate, a second blocking layer of the first conductive type formed on this first blocking layer, a V-channel extending from the second blocking layer through the first blocking layer to the semiconductor substrate, and a stripe-geometry light-emitting region formed on the semiconductor substrate inside the V-channel. Light is externally emitted from one edge of the light-emitting region due to a flow of current in the light-emitting region, to which the current is confined by the blocking layers. The LED is characterized by having a second V-channel disposed at a certain distance from the other edge of the light-emitting region, on the optical path of the light emitted from this other edge, and an absorbing region formed on the semiconductor substrate in the second V-channel that absorbs the light emitted from the other edge of the light-emitting region.

An output of spontaneously-emitted light is produced from one edge of the light-emitting region formed by the first V-channel, while the light generated from the other edge of the light-emitting region is absorbed by the stripe-geometry absorbing region formed on its optical path in the second V-channel. In this way stimulated emission in the light-emitting region is suppressed, and an output of spontaneously-emitted light is obtained from the facet of the LED that forms the emitting edge of the light-emitting region.

A method for fabricating an LED comprises the steps of forming a first blocking layer of a second conductive type, forming a second blocking layer of a first conductive type on the first blocking layer, forming, on the semiconductor substrate with the first and second blocking layers, first and a second V-channels of such depth as to extend from the second blocking layer through the first blocking layer to the semiconductor substrate, the two V-channels being colinear and disposed with their facing ends separated by a certain distance, depositing a first cladding layer of the first conductive type, an active layer of the first conductive type, and a second cladding layer of the second conductive type in this sequence in the first and second V-channels to form a first and a second active region, forming an insulating layer on the second cladding layer above the second active region, and forming an electrode layer on the second cladding layer above the first active region.

A light-emitting region and an absorbing region are formed by sequential epitaxial growth of a first cladding layer, an active layer, and a second cladding layer on the inner surfaces of the first and second V-channels. Alignment of the first and second V-channels are facilitated by their being formed in the same step, so this method produces a highly accurate optical coupling between the light-emitting region and the absorbing region.

DETAILED DESCRIPTION OF THE EMBODIMENTS

Figure 2A:
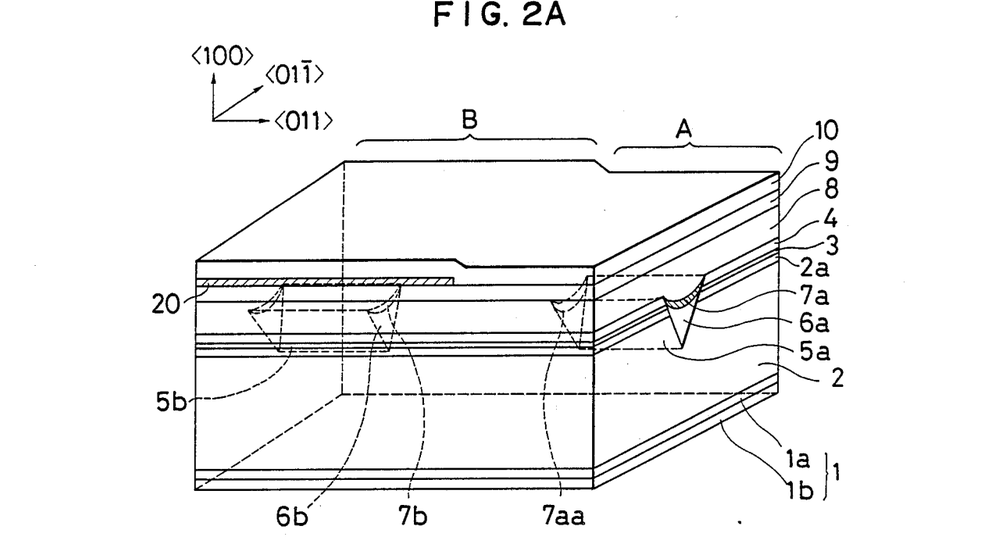
FIGS. 2A and 2B are an oblique view and a plan view of an embodiment of an LED according to the present invention.
Figure 2B:
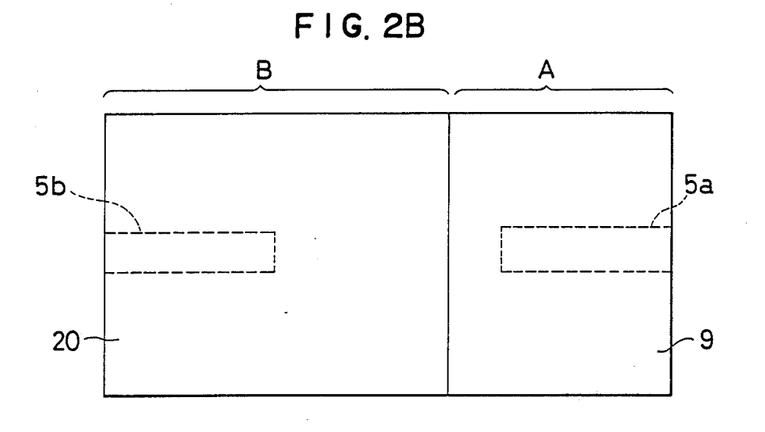

FIGS. 2A and 2B show the structure of an embodiment of an InGaAsP/InP EELED according to this invention. FIG. 2A shows a general oblique view; FIG. 2B shows a plan view with the second electrode omitted.

A semiconductor substrate 2 in the above structure is a (100) surface p-InP substrate (with a carrier density $p \cong 4 \times 10^{18} cm^{-3}$ and etch pit density EPD $<5 \times 10^{3} cm^{-2}$).

On the lower surface of the semiconductor substrate 2 is an Au-AuZn electrode 1a and a Ti-Pt-Au electrode 1b that form a first electrode 1.

A buffer layer 2a consisting of a Zn-doped p-InP layer (1 μm thick with a carrier concentration $p \cong 7 \times 10^{17} cm^{-3}$) is formed over the substrate 2. A first blocking layer 3 consisting of an Sn-doped n-InP layer (0.5 μm thick with a carrier concentration $n \cong 5 \times 10^{17} cm^{-3}$) and a second blocking layer 4 consisting of a Zn-doped p-InP layer (1.5 μm thick with a carrier density $p \cong 5 \times 10^{17} cm^{-3}$) are grown on the p-InP substrate 2a.

On the substrate 2 with the first and second blocking layers 3 and 4 is formed a pair of colinear V-channels (a first V-channel 5a and a second V-channel 5b) separated by a certain distance between their ends, of such a depth as to extend from the second blocking layer 4 through the first blocking layer 3 to the substrate 2. Facets of the V-channels 5a and 5b are (111) surfaces.

First cladding layers 6a and 6b consisting of a Zn-doped p-InP layer (with a carrier concentration $p \cong 6 \times 10^{17} cm^{-3}$) are formed on the inner surfaces of the V-channels 5a and 5b, and active layers 7a and 7b consisting of a Zn-doped p-InGaAsP layer ($\lambda g = 1.3$ μm, active layer 3 μm wide and 0.3 μm thick) are grown on the first cladding layers 6a and 6b.

A second cladding layer 8 consisting of an Sn-doped n-InP layer (0.7 μm thick with a carrier concentration $n \cong 6 \times 10^{17} cm^{-3}$) is formed on the active layers 7a and 7b in the V-channels 5a and 5b, and on the second blocking layer 4. A cap layer 9 consisting of an Sn-doped n-InGaAsP layer ($\lambda g = 1.2$ μm, 0.5 μm thick) is formed on the second cladding layer 8.

Thus a pair of stripe-geometry active layers 7a and 7b are formed in the first V-channel 5a and the second V-channel 5b on the substrate 2, sandwiched between the first cladding layers 6a and 6b and the second cladding layer 8.

In this embodiment, moreover, an insulating layer 20 comprising an $SiO_2$ film is formed directly above the second V-channel 5b, i.e., on that side of the upper surface of the cap layer 9 where the second V-channel 5b is disposed (the left half of the upper surface of the cap layer 9 in the drawing). An Au-Ge-Ni layer 10 is formed as a common second electrode over the insulating layer 20 and the part of the cap layer 9 situated above the first V-channel 5a that is not covered by the insulating layer 20.

In the structure described above, the first active layer 7a formed on the first V-channel 5a functions as a light-emitting region having the form of a stripe enclosed between cladding layers 6a and 8 (on the A side in the drawing). The drive current entering at the first electrode 1 is confined by the first blocking layer 3 and the second blocking layer 4 and supplied to the light-emitting region, then flows via the second cladding layer 8, which is coupled to the first active layer 7a, and the cap layer 9 to the second electrode 10. In response to the drive current, the light-emitting region produces a spontaneous emission of light which is externally emitted from one edge [the shaded edge on the right side in FIG. 2A] and internally emitted from the other edge 7aa.

The second active layer 7b formed on the second V-channel 5b functions as an absorbing redion having the form of a stripe enclosed between cladding layers 6b and 8 (on the B side in the drawing). The drive current entering at the first electrode 1 is blocked by the insulating layer 20 and does not enter the second active layer 7b, so this absorbing region does not emit light. The function of this absorbing region, which is situated on the optical path of the light emitted from the other edge 7aa of the light-emitting region, is to absorb the light emitted by the light-emitting region so that it does not return to the light-emitting region. Thus, since the light-emitting region does not receive reflected light from the left edge of the absorbing region as shown in FIG. 2A, no stimulated emission occurs in the light-emitting region, enabling the light-emitting region to maintain a stable spontaneous emission and continue to provide a stable output of spontaneously emitted light.

Figure 3A:
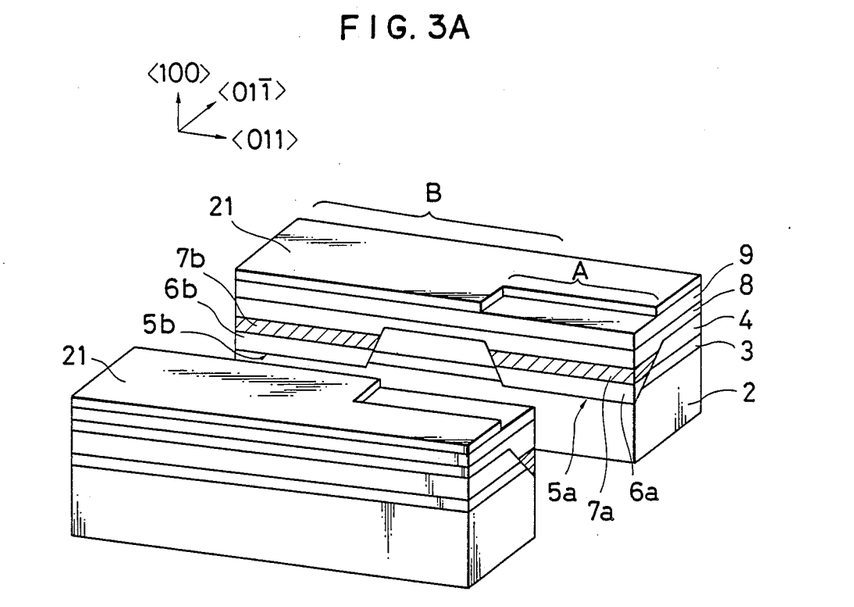
FIGS. 3A and 3B are an oblique view and a plan view of another embodiment of an LED according to the present invention.
Figure 3B:
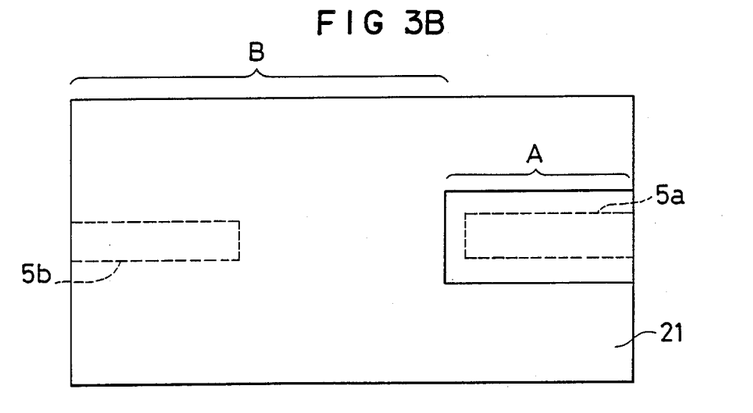

Next, another embodiment of the invention will be described according to FIGS. 3A and 3B. FIG. 3A is an oblique view showing the LED cut away along the base of the V-channel, while FIG. 3B is a plan view. For purposes of explanation, the components of this embodiment that are identical to those of the embodiment of FIGS. 2A and 2B are indicated by the same reference numerals. The shape of the insulating layer 21 differs from that in the embodiment of FIGS. 2A and 2B. In the embodiment of FIGS. 2A and 2B, the insulating layer was formed over substantially half of the upper surface of the cap layer 9, but in the embodiment of FIG. 3, the insulating layer 21 is formed over the entire surface except for the part facing the top of the first V-channel 5a. In this structure, in which the insulating layer 21 is formed on the greater part of the upper surface of the cap layer 9, the current injected into the first active layer 7a is channeled to the second electrode (not shown in the drawing) through the part above the first V-channel 5a where the insulating layer 21 is absent, so the probability of current entering the second active layer 7b is less than in the embodiment of FIGS. 2A and 2B, for which the light-absorbing performance of the absorbing region is extremely good. The stimulated emission of light occurring due to the reception of reflected light from the left edge of the absorbing region in FIG. 3A by the light-emitting region can thus be held to an extremely low level, enabling a stable, continuous, external output of spontaneously emitted light.

Next the characteristics of the embodiment of FIGS. 2A and 2B will be described with reference to FIGS. 4 to 6.

Figure 4:
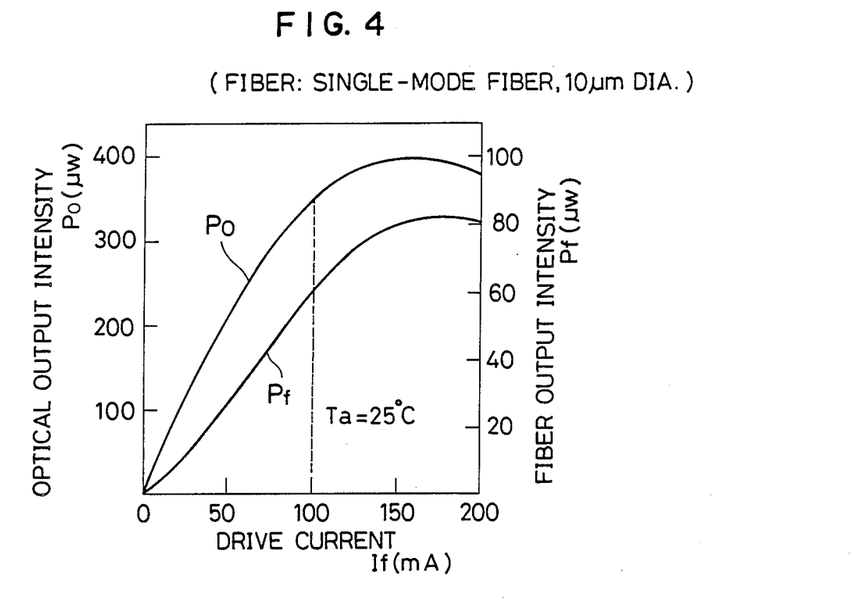
FIG. 4 is a graph of the drive current vs. optical output characteristic of the embodiment of FIG. 2.

FIG. 4 is a graph showing the drive current vs. optical output characteristic curve Po and the drive current vs. fiber output characteristic curve Pf. The characteristic curve Po was obtained by measuring the optical output from the LED after stabilization of the driving current of the LED. The characteristic curve Pf was obtained by coupling the LED into a single-mode fiber having a core diameter of 10 $\mu$m and measuring the optical output from the fiber after stabilization of the driving current of the LED. When the drive current If was 100mA as shown in FIG. 4, Pf was substantially 60 $\mu$W and Po was substantially 350 $\mu$W, so the coupling efficiency Pf/Po was approximately 17%, a much higher value than the values of 5 to 10% obtained previously.

Figure 5:
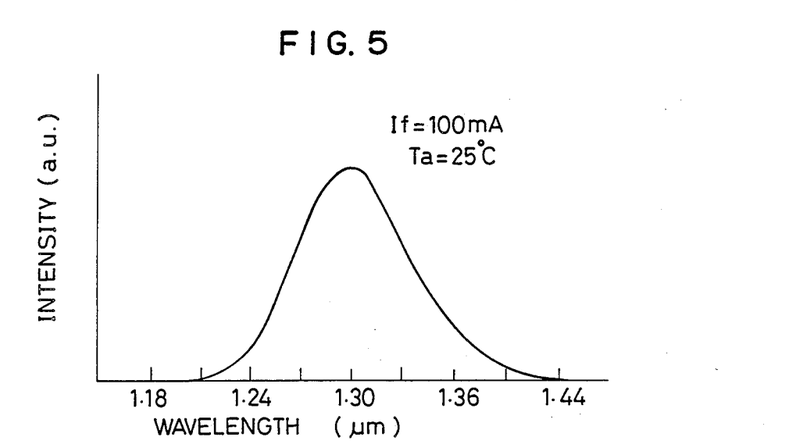
FIG. 5 is a graph of the emission spectrum of the embodiment of FIG. 2.

FIG. 5 is a graph showing the emission spectrum characteristic at an ambient temperature Ta of 25° C. FIG. 5 indicates a stable spontaneous emission characteristic, with no Fabry-Perot modes observed in the vicinity of the peak wavelength. The emitted light thus consists only of spontaneously emitted components.

Figure 6:
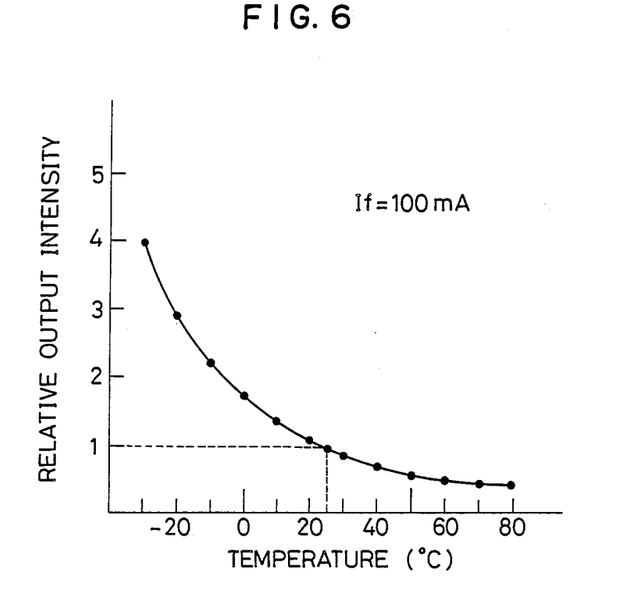
FIG. 6 is a graph of the temperature vs. relative optical output intensity characteristic of the embodiment of FIG. 2.

FIG. 6 is a graph showing the temperature dependence of the optical output when the drive current If was 100mA. The scale on this graph indicates optical output intensity relative to the optical output intensity (1) at 25° C. It was observed from this graph that the optical output intensity was stable with respect to temperature, having a temperature coefficient ($\Delta P/\Delta T$ $P_{25}$) of $-1.3\%/°$C. in the range from 20° to 25° C. and $-0.9\%/°$C. the range from 25° to 80° C., where $\Delta P$ is the change in the optical output intensity, $\Delta T$ is the change in temperature, and $P_{25}$ is the optical output intensity at 25° C.

Next, the fabrication method of the invention will be described.

FIGS. 7A to 7H are diagrams illustrating the fabrication process of the LED of the embodiment of FIG. 2. In the first step [shown in FIG. 7A], a first blocking layer 3 comprising an n-InP layer and a second blocking layer 4 comprising a p-InP layer are formed by liquid-phase epitaxy on a p-InP substrate 2 covered by a buffer layer 2a comprising a p-InP layer.

Figure 7A:
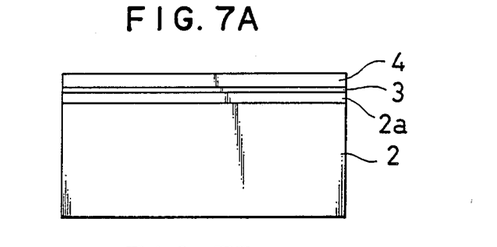
FIGS. 7A to 7H relate to a method for fabricating an LED according to this invention, and illustrate the fabrication process of the embodiment of FIG. 2.
Figure 7B:
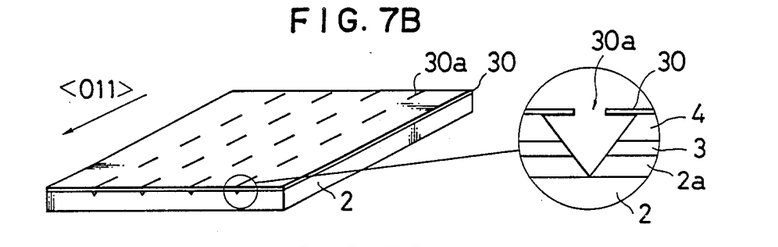

In the next step [shown in FIG. 7B], an $SiO_2$ film 30 is grown uniformly over the second blocking layer 4, then removed from selected locations by a photolithography technique to form an etching mask 30 having stripe-shaped windows 30a. The windows 30a are elongated parallel to the <011> crystal axis. The reason for this is that if the direction of the crystal axis is disregarded when chemical etching is carried out to form the V-channels, a V-channel will not be obtained, or it will become difficult to grow layers by liquid-phase epitaxy inside the V-channels.

Figure 7C:
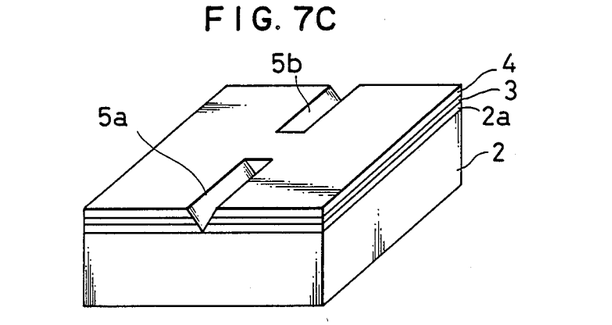
Figure 7D:
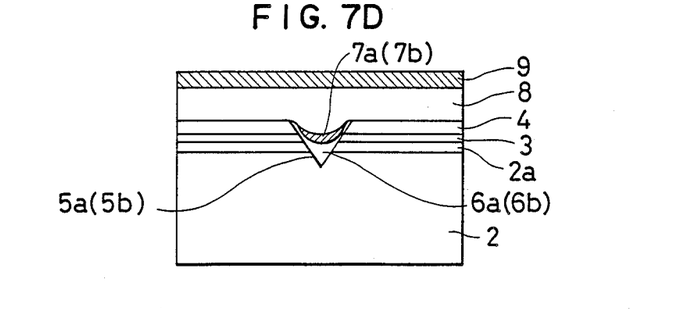

After this, an etchant comprising a 3:1 volumetric mixture of hydrochloric acid (HCl) and phosphoric acid ($H_3PO_4$) is used to etch a first V-channel 5a and a second V-channel 5b as shown in FIG. 7C. Note that FIGS. 7C to 7G show only part of the structure shown in FIG. 7B.

After this, first cladding layers 6a and 6b comprising a p-InP layer are grown in the first V-channel 5a and the second V-channel 5b respectively, active layers 7a and 7b comprising a p-InGaAsP layer are grown thereon, and over these is grown a second cladding layer 8 comprising an n-InP layer, covering the surfaces of the V-channels 5a and 5b and the second blocking layer 4. On the upper surface of this layer is next grown a cap layer 9 [shown in FIG. 7D] comprising an n-InGaAsP layer. The first cladding layers 6a and 6b, the active layers 7a and 7b, the second cladding layer 8, and the cap layer 9 are formed by liquid-phase epitaxy. Since the rate of liquid-phase epitaxial growth of a layer depends strongly on the surface orientation of the layer below, the rate of growth of the layers is fast on the sloping sides of the V-channels 5a and 5b and slow on the (100) surface of the substrate 2. The result is that growth of the above-mentioned layers is concentrated on the inner surfaces of the V-channels 5a and 5b, leading to formation of the first cladding layers 6a and 6b and the active layers 7a and 7b.

Figure 7E:
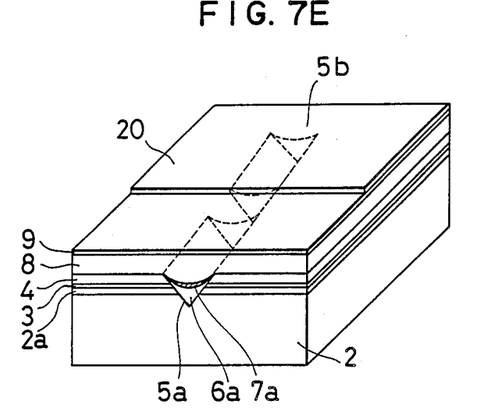
Figure 7F:
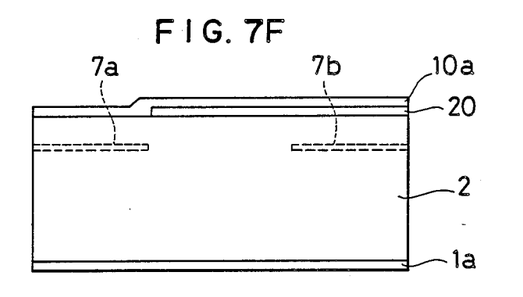

Next, an $SiO_2$ insulating layer 20 [shown in FIG. 7E] is selectively deposited on the cap layer 9 such that it covers the second V-channel 5b but not the first V-channel 5a.

Following this, an Au-AuZn layer 1a is formed on the lower surface of the substrate 2, and an Au-Ge-Ni layer 10a is formed by resistive thermal evaporation on the uppermost layers on the substrate 2: that is, on the cap layer 9 over the first V-channel 5a and on the insulating layer 20 over the second V-channel 5b. These electrode layers 1a and 10a are then heated together with the substrate 2 to create ohmic contacts [shown in FIG. 7F].

Figure 7G:
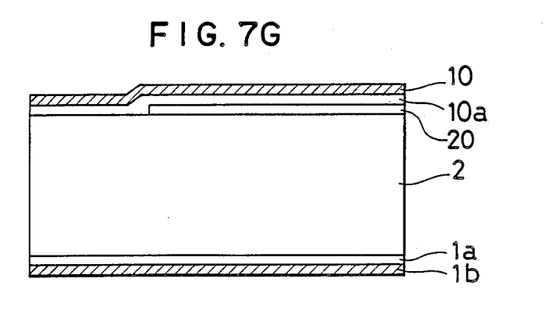

After that, Ti-Pt-Au layers 1b and 10b are formed by electron-beam evaporation on the Au-AuZn layer 1a and the Au-Ge-Ni layer 10a, creating electrode regions [shown in FIG. 7G] for wire bonding or dice bonding.

Figure 7H:
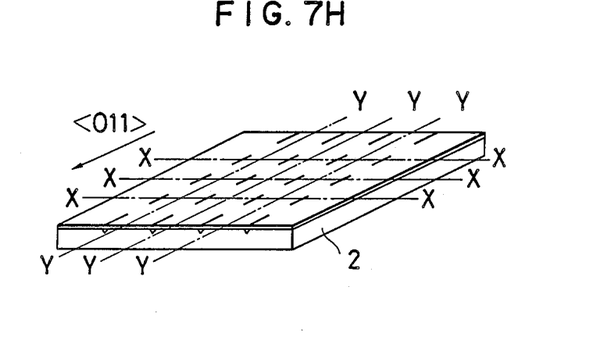

Finally, the substrate 2 on which the above layers have been formed is diced into chips along lines X—X, Y—Y [shown in FIG. 7H] to create the necessary edge facets. These are mounted on an SiC chip-type heat sink by the usual junctiondown method and wire-bonded with gold wires to create EELED's.

Next, another embodiment of a fabrication process will be explained.

FIG. 8A to 8I are a process diagram illustrating another embodiment of a fabrication method according to this invention. FIGS. 8A to 8I show a part of the substrate 2 which has not yet diced.

In this embodiment, a Zn-doped p-InP substrate (with a carrier concentration $p \approx 5 \times 10^{18}$ cm$^{-3}$) is used as the substrate 2. As in the embodiment shown in FIG. 7A, a first blocking layer 3 (approximately 0.5 μm thick) comprising an n-InP layer and a second blocking layer 4 comprising a p-InP layer (approximately 1.5 μm thick) are formed on the substrate 2, with an intervening buffer layer 2a comprising a p-InP layer (approximately 1 μm thick). These layers 2a, 3, and 4 are formed by liquid-phase epitaxy, during which they are heated to about 600° C. In addition, an etching mask layer 4a comprising a SiO$_2$ film (approximately 1500Å thick) is deposited by a thermal CVD technique on the second blocking layer 4, then the etching mask layer 4a is covered with a positive resist coating 4b [shown in FIG. 8A].

Figure 8A:
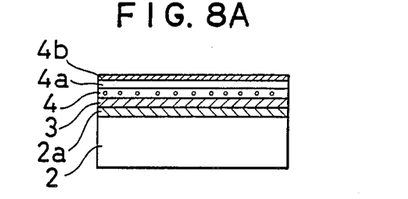
FIGS. 8A through 8I illustrate another embodiment of the method for the fabricating an LED.
Figure 8B:
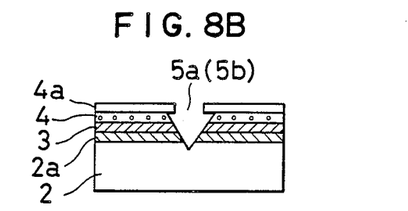
Figure 8C:
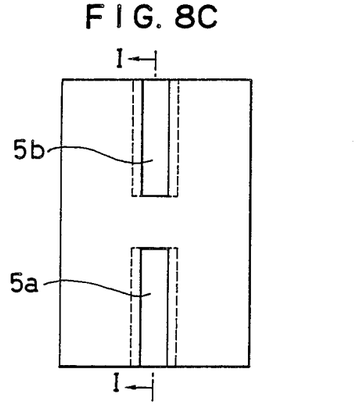
Figure 8D:
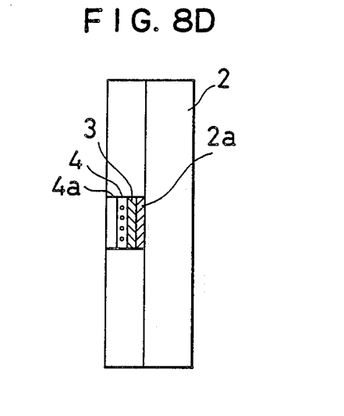
Figure 8E:
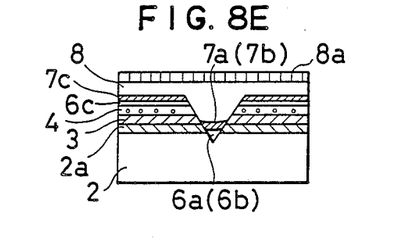

Next, a photolithography step is performed to create stripe-shaped windows in two locations per device in the positive photoresist 4b, after which the etching mask 4 is etched in a hydrofluoric acid (HF) solution to create stripe-shaped windows 2 μm wide in two locations per device. After the no-longer-needed positive resist 4b is removed with acetone, a mixture of hydrochloric acid and phosphoric acid is used to etch V-channels 5a and 5b in the substrate 2. FIG. 8C is a plan view showing the structure of the substrate 2 after the preceding steps, and FIG. 8D is a sectional view along the line I—I in FIG. 8C. As is clear from FIG. 8D, the buffer layer 2a, the first blocking layer 3, and the second blocking layer 4 are grown in this sequence from bottom to top in the space between the first V-channel 5a and the second V-channel 5b.

Next, the etching mask 4a is removed with a hydrofluoric acid solution, and then a first cladding layer comprising a p-InP layer approximately 1.5 μm thick (6a and 6b in the V-channels, 6c on the flat surface), an active layer comprising a p-InGaAsP layer approximately 0.15 μm thick (7a and 7b in the V-channels, and 7c on the flat surface), and a second cladding layer 8 comprising an n-InP layer approximately 3 μm thick are deposited in this sequence under heating to approximately 600° C. Then an etching mask 8a comprising an SiO$_2$ film is formed by a CVD technique covering the upper surface of the second cladding layer 8 [shown in FIG. 8E].

Figure 8F:
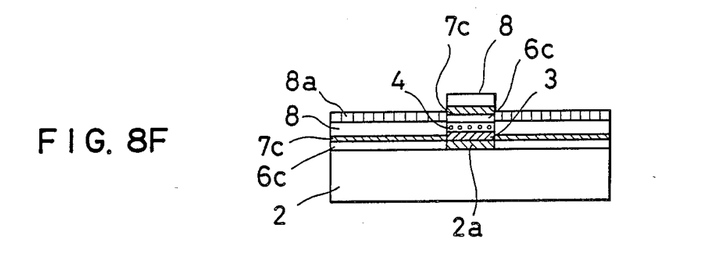
Figure 8G:
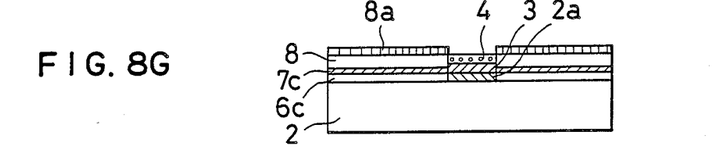

Next, the etching mask 8a is coated with a positive resist (not shown in the drawing), after which a routine photolithography step is performed to remove the positive resist except from above the first V-channel 5a and the second V-channel 5b, and the etching mask 8a is removed except from above the first V-channel 5a and the second V-channel 5b. FIG. 8F is a sectional side view of the structure of the substrate 2 after the preceding steps. Processes described above are the same as that of FIGS. 7A to 7C.

After that, the first cladding layer 6c, the active layer 7c, and the second cladding layer 8 that have been deposited between the first V-channel 5a and the second V-channel 5b are removed. Specifically, after removal of the n-InP second cladding layer 8 is removed with hydrochloric acid (HCl), and then the p-InGaAsP active layer 7 is removed with a mixture of nitric acid (HNO$_3$), hydrofluoric acid (HF), and water (H$_2$O) in the ratio HNO$_3$:HF:H$_2$O=3:1:2. Then the p-InP first cladding layer 6c is similarly removed with hydrochloric acid [shown in FIG. 8G].

Figure 8H:
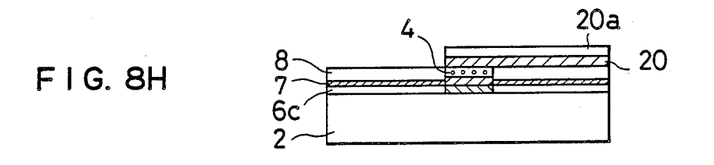
Figure 8I:
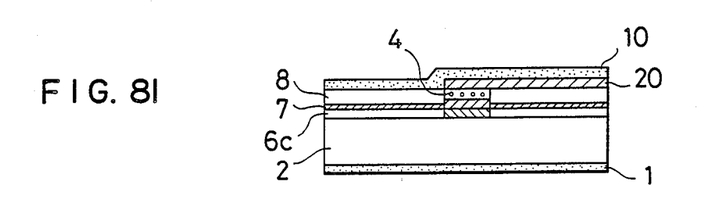

Next, the etching mask layer 8a is removed, and then an insulating layer 20 comprising a SiO$_2$ film is formed by a CVD technique on the substrate 2, and the insulating layer 20 disposed above the first V-groove 5a is removed using a positive resist 20a [shown in FIG. 8H].

Next, the positive resist 20a is removed, and then a second electrode 10 comprising an Au-Ge-Ni film is formed by vacuum evaporation on the uppermost surface of the substrate 2, and a first electrode 1 comprising an AuZn film is formed on the lower surface of the substrate 2. Then the entire substrate 2 is heated to approximately 420° C. to create ohmic contacts at the electrodes [shown in FIG. 8I]. Finally, the substrate 2 with some layers is diced into chips in the same way as shown in FIG. 7H.

In the embodiment the cladding layers 6a and 8 and the active layer 7c disposed between the first V-channel 5a and the second V-channel 5b are removed by etching, so the electrical isolation of the absorbing region comprising the active layer 7b formed in the second V-channel 5b is complete and the drive current is completely prevented from flowing through the active layer 7b is the second V-channel 5b.

The embodiments described above concerned an InGaAsP/InP LED with an InP substrate, but this invention is not limited to that configuration and can also be applied to an AlGaAs/GaAs LED with a GaAs substrate.

As explained above, this invention is capable of providing an LED with excellent characteristics in which a stable output of spontaneously-emitted light from the lightemitting region can be obtained even at high current density levels or in low-temperature operation.

The fabrication method forms the first V-channel and the second V-channel on the substrate in the same step, then forms active layers enclosed by cladding layers in the V-channels, so the light-emitting region and the absorbing region can be aligned with extremely high accuracy, enabling an extremely good optical coupling to be created between the light-emitting region and the absorbing region. Another effect of the fabrication method is that it is easy to carry out because it can be performed without major changes to the previous fabrication method.

What is claimed is:

1. A light-emitting diode comprising:
   a semiconductor substrate of a first conductive type having an upper and lower surface;
   a first electrode formed on the lower surface of said semiconductor substrate;
   a first blocking layer of a second conductive type formed on the upper surface of said semiconductor substrate;
   a second blocking layer of the first conductive type formed on said first blocking layer;

a first V-channel extending from said second blocking layer through said first blocking layer to said semiconductor substrate;

a stripe-geometry light-emitting region formed on said semiconductor substrate in said first V-channel;

wherein an electrical current confined by said blocking layers and flowing in said ligh-emitting region causes an emission of light external the light-emitting diode from one edge of said light-emitting region and an emission of light internal the light-emitting diode from an other edge of said light-emitting region;

a second V-channel extending from said second blocking layer through said first blocking layer to said semiconductor substrate, and being disposed on an optical path of the light emitted from said other edge of said light-emitting region;

a stripe-geometry absorbing region formed on said semiconductor substrate in said second V-channel, for absorbing the light emitted from said other edge of said light-emitting region;

an insulating layer disposed above said absorbing region formed in said second V-channel; and a second electrode disposed above said first V-channel;

wherein said semiconductor substrate has a first end surface and a second end surface opposite to said first end surface;

said first and second V-channels extend in a direction orthogonal to said first and second end surfaces and aligned in said direction, said light-emitting region and said absorbing region extend in said direction and aligned in said direction;

said optical path extends in said direction;

said one edge of said light-emitting region coincides with said first end surface of said semiconductor substrate;

said absorbing region is interposed between said other edge of said light-emitting region and said second end surface of said semiconductor substrate; and said first and second blocking layers have parts being interposed between said other edge of said light-emitting region and an edge of said absorbing region facing said other edge of said light-emitting region.

2. A light-emitting diode according to claim 1, wherein said first conductive type is p type, and said second conductive type is n type.

3. A light-emitting diode according to claim 1, wherein said first conductive type is n type, and said second conductive type is p type.

4. A light-emitting diode according to claim 1, wherein said light-emitting region is formed of an active layer of the second conductive type sandwiched between cladding layers.

5. A light-emitting diode according to claim 4, wherein said active layer consists of InGaAsP semiconductor.

6. A light-emitting diode according to claim 1, wherein said absorbing region is formed of an active layer of the second conductive type sandwiched between cladding layers.

7. A light-emitting diode according to claim 6, wherein said active layer consists of InGaAsP semiconductor.

8. A light-emitting diode according to claim 1, further comprising a cap layer above said semiconductor substrate, wherein said insulating layer is disposed over substantially half of the upper surface of said cap layer.

9. A light-emitting diode according to claim 8, wherein said second electrode is formed on said insulating layer and a part of said cap layer that is not covered by said insulating layer.

10. A light-emitting diode according to claim 1, further comprising a cap layer above said semiconductor substrate, wherein said insulating layer is disposed over the entire surface of said cap layer except for the part facing the top of said first V-channel.

11. A light-emitting diode according to claim 10, wherein said second electrode is formed on said insulating layer and a part of said cap layer that is not covered by said insulating layer.

12. A light-emitting diode according to claim 1, further comprising:

a cladding layer formed over said second blocking layer, said stripe-geometry light-emitting region and said stripe-geometry absorbing region; and a cap layer formed over said cladding layer;

said insulating region being formed over said cap layer at an area directly above said stripe-geometry absorbing region; and said second electrode being formed on said insulating layer and the part of said cap layer that is not covered by said insulating layer.

13. A light-emitting diode according to claim 12, wherein said insulating layer is formed over the entire surface of said cap layer except at the area directly above said stripe-geometry light-emitting region.

14. A light-emitting diode according to claim 1, wherein said direction orthogonal to said first and second end surfaces is a direction coincident with a crystal axis.

* * * * *